(12) United States Patent
Sankala

(10) Patent No.: US 10,944,346 B2
(45) Date of Patent: Mar. 9, 2021

(54) DEVICE AND A METHOD FOR ESTIMATING INDUCTANCES OF AN ELECTRIC MACHINE

(71) Applicant: Vacon Oy, Vaasa (FI)

(72) Inventor: Arto Sankala, Tampere (FI)

(73) Assignee: Vacon OY, Vaasa (FI)

( * ) Notice: Subject to any disclaimer, the term of this patent is extended or adjusted under 35 U.S.C. 154(b) by 152 days.

(21) Appl. No.: 16/360,204

(22) Filed: Mar. 21, 2019

(65) Prior Publication Data

US 2019/0356255 A1   Nov. 21, 2019

(30) Foreign Application Priority Data

May 15, 2018   (EP) .................................... 18172259

(51) Int. Cl.
*H02P 21/14*   (2016.01)
*H02P 21/06*   (2016.01)
(Continued)

(52) U.S. Cl.
CPC .......... *H02P 21/14* (2013.01); *G01R 27/2611* (2013.01); *H02P 21/06* (2013.01);
(Continued)

(58) Field of Classification Search
USPC .................................................. 318/400.02
See application file for complete search history.

(56) References Cited

U.S. PATENT DOCUMENTS

| 6,967,461 B1* | 11/2005 | Markunas | ............... H02P 6/185 318/700 |
| 2010/0060210 A1* | 3/2010 | Liu | ......................... H02P 21/14 318/400.02 |

(Continued)

FOREIGN PATENT DOCUMENTS

| EP | 2555420 A1 | 2/2013 |
| EP | 2693226 A1 | 2/2014 |

(Continued)

OTHER PUBLICATIONS

Extended European Search Report for U.S. Appl. No. EP 18 17 2259 dated Nov. 6, 2018.

*Primary Examiner* — Jorge L Carrasquillo
(74) *Attorney, Agent, or Firm* — McCormick, Paulding & Huber PLLC

(57) ABSTRACT

A device for estimating inductances of an electric machine having a salient-pole rotor is presented. The device comprises a processing system that controls stator voltages to constitute a balanced multi-phase alternating voltage when the rotor is stationary. The processing system estimates a position of the rotor based on a negative sequence component of stator currents. To estimate the quadrature-axis inductance, the processing system controls direct-axis current to be direct current and quadrature-axis voltage to be alternating voltage. The quadrature-axis inductance is estimated based on the quadrature-axis alternating voltage and on quadrature-axis alternating current. To estimate the direct-axis inductance, the processing system controls direct-axis voltage to be alternating voltage and the quadrature-axis voltage to be zero. The direct-axis inductance is estimated based on the direct-axis alternating voltage and on direct-axis alternating current.

19 Claims, 5 Drawing Sheets

(51) Int. Cl.
  *H02P 21/18*    (2016.01)
  *H02P 27/08*    (2006.01)
  *H02P 21/22*    (2016.01)
  *H02P 25/022*   (2016.01)
  *G01R 27/26*    (2006.01)
  *H02P 25/092*   (2016.01)

(52) U.S. Cl.
  CPC .............. *H02P 21/18* (2016.02); *H02P 21/22* (2016.02); *H02P 25/022* (2013.01); *H02P 25/092* (2016.02); *H02P 27/08* (2013.01)

(56) References Cited

U.S. PATENT DOCUMENTS

| | | | |
|---|---|---|---|
| 2011/0031909 A1* | 2/2011 | Ohgushi | H02P 21/16 318/400.02 |
| 2013/0173193 A1* | 7/2013 | Yan | G01R 31/34 702/66 |
| 2014/0232314 A1* | 8/2014 | Hachiya | H02P 21/16 318/490 |
| 2016/0233807 A1* | 8/2016 | Rogg | H02P 21/14 |
| 2017/0085202 A1* | 3/2017 | Yoo | H02P 21/14 |
| 2018/0109218 A1* | 4/2018 | Huh | H02P 21/18 |
| 2019/0273457 A1* | 9/2019 | Deng | H02P 21/22 |

FOREIGN PATENT DOCUMENTS

| | | |
|---|---|---|
| EP | 2757683 A1 | 7/2014 |
| EP | 301627 A1 | 5/2016 |
| EP | 3054583 A1 | 8/2016 |
| WO | 2013037472 A2 | 3/2013 |

\* cited by examiner

DEVICE AND A METHOD FOR ESTIMATING INDUCTANCES OF AN ELECTRIC MACHINE

CROSS-REFERENCE TO RELATED APPLICATION

This application claims foreign priority benefits under U.S.C. § 119 to European Patent Application No. 18172259.6 filed on May 15, 2018, the content of which is hereby incorporated by reference in its entirety.

TECHNICAL FIELD

The disclosure relates generally to parameter identification of electric machines. More particularly, the disclosure relates to a device and to a method for estimating inductances of an electric machine. Furthermore, the disclosure relates to a power electronic converter for driving an electric machine, e.g. a synchronous reluctance machine. Furthermore, the disclosure relates to a computer program for estimating inductances of an electric machine.

BACKGROUND

Self-commissioning is a functionality of a power electronic converter that enables faster commissioning of an electric drive and reduces a risk of user errors. In self-commissioning, a power electronic converter performs a predefined set of measurements to estimate parameters of an electric machine. The estimated parameters are relevant to control of the electric machine, and the parameters may comprise for example inductance parameters and resistance parameters. In conjunction with an electric machine having a salient-pole rotor, the inductance parameters comprise direct-axis inductance and quadrature-axis inductance related to the stator windings of the electric machine. In a case where an electric machine has windings also in its rotor, the inductance parameters may further comprise inductances related to the rotor and mutual inductances between the stator windings and the rotor windings.

In many cases, there is a need to model the effect of magnetic saturation in the inductances of an electric machine. Thus, a process for estimating the inductances of an electric machine should be suitable for estimating the inductances as functions of currents. The situation is further complicated by the cross-saturation effect where the direct-axis inductance is dependent not only on direct-axis currents but also on quadrature-axis currents and, correspondingly, the quadrature-axis inductance is dependent not only on the quadrature-axis currents but also on the direct-axis currents.

In many cases, there is a requirement that the rotor of an electric machine does not need to be disconnected from a mechanical load during the estimation of the inductances. Thus, the inductances need to be estimated when the rotor is stationary i.e. non-rotating. On the other hand, currents injected to the electric machine when estimating the inductances should not cause excessive torques on the rotor so as to avoid a need to lock the rotor to be stationary during the estimation process. Estimation of inductances of a stationary electric machine requires typically information indicative of rotational position of a rotor with respect to stator windings. Thus, the process for estimating the inductances comprises advantageously a sub-process for estimating the rotational position of the rotor.

SUMMARY

The following presents a simplified summary to provide a basic understanding of some aspects of different invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying and non-limiting embodiments of the invention.

In accordance with the invention, there is provided a new device for estimating inductances of an electric machine when the rotor of the electric machine is stationary. The electric machine can be for example a synchronous reluctance machine, a permanent magnet machine having saliency, a permanent magnet assisted synchronous reluctance motor, or a salient-pole electrically excited synchronous machine.

A device according to the invention comprises a processing system configured to:
  control stator voltages of the electric machine to constitute a balanced multi-phase alternating voltage,
  estimate rotational position of the rotor based on a negative sequence component of stator currents of the electric machine, the negative sequence component being caused by the saliency of the rotor,
  control direct-axis current of the electric machine to be direct current "DC" and quadrature-axis voltage of the electric machine to be alternating "AC" voltage,
  estimate the quadrature-axis inductance of the electric machine based on the quadrature-axis alternating voltage and on quadrature-axis alternating current caused by the quadrature-axis alternating voltage,
  control direct-axis voltage of the electric machine to be alternating voltage and the quadrature-axis voltage of the electric machine to be substantially zero, and
  estimate the direct-axis inductance of the electric machine based on the direct-axis alternating voltage and on direct-axis alternating current caused by the direct-axis alternating voltage.

The ratio of the amplitude of the balanced multi-phase alternating voltage and the frequency of the balanced multi-phase alternating voltage, i.e. the U/f-ratio, is advantageously selected to be so low that the resulting rotating magnetic flux is not able to accelerate the rotor to rotate together with the magnetic flux, but the rotor is substantially stationary. Thus, due to the saliency of the rotor, the reluctance encountered by the rotating magnetic flux varies depending on a varying angle between the direct-axis of the rotor and the rotating magnetic flux and therefore the negative sequence component of the stator currents is formed. The above-mentioned balanced multi-phase alternating voltage needs to be however so strong that the negative sequence component is sufficient for reliable detection. The trajectory of the space-vector of the stator currents deviates from a circle due to the negative sequence component, and the orientation of the non-circular trajectory with respect to magnetic-axes of the stator phases is indicative of the rotational position of the rotor.

The direct-axis DC-current which is supplied to the electric machine during the estimation of the quadrature-axis inductance provides two advantages. Firstly, the direct-axis DC-current keeps the rotor substantially stationary and thus prevents the position of the rotor from drifting away from its desired position. For example, in a case where a rotor of a synchronous reluctance machine is not locked to be stationary and there is no direct-axis current, a slight error in the orientation between the rotor and the quadrature-axis current for inductance estimation might result in small torque that might drift the rotor away from its desired rotational position. Secondly, the direct-axis DC-current can be varied for obtaining estimates of the quadrature-axis inductance corresponding to various levels of magnetic saturation.

In accordance with the invention, there is provided also a new power electronic converter that comprises:
- a converter stage for forming stator voltages for an electric machine,
- a controller for controlling the stator voltages at least partly based on stator currents of the electric machine, and
- a device according to the invention for estimating the direct-axis and quadrature-axis inductances of the electric machine when the rotor of the electric machine is stationary.

In accordance with the invention, there is provided also a new method for estimating inductances of an electric machine when the rotor of the electric machine is stationary. A method according to the invention comprises:
- controlling stator voltages of the electric machine to constitute a balanced multi-phase alternating voltage,
- estimating rotational position of the rotor based on a negative sequence component of stator currents of the electric machine, the negative sequence component being caused by saliency of the rotor,
- controlling direct-axis current of the electric machine to be direct current and quadrature-axis voltage of the electric machine to be alternating voltage,
- estimating the quadrature-axis inductance of the electric machine based on the quadrature-axis alternating voltage and on quadrature-axis alternating current caused by the quadrature-axis alternating voltage,
- controlling direct-axis voltage of the electric machine to be alternating voltage and the quadrature-axis voltage of the electric machine to be substantially zero, and
- estimating the direct-axis inductance of the electric machine based on the direct-axis alternating voltage and on direct-axis alternating current caused by the direct-axis alternating voltage.

In accordance with the invention, there is provided also a new computer program for estimating inductances of an electric machine when the rotor of the electric machine is stationary. A computer program according to the invention comprises computer executable instructions for controlling a programmable processor to:
- control stator voltages of the electric machine to constitute a balanced multi-phase alternating voltage,
- estimate rotational position of the rotor based on a negative sequence component of stator currents of the electric machine, the negative sequence component being caused by saliency of the rotor,
- control direct-axis current of the electric machine to be direct current and quadrature-axis voltage of the electric machine to be alternating voltage,
- estimate the quadrature-axis inductance of the electric machine based on the quadrature-axis alternating voltage and on quadrature-axis alternating current caused by the quadrature-axis alternating voltage,
- control direct-axis voltage of the electric machine to be alternating voltage and the quadrature-axis voltage of the electric machine to be substantially zero, and
- estimate the direct-axis inductance of the electric machine based on the direct-axis alternating voltage and on direct-axis alternating current caused by the direct-axis alternating voltage.

In accordance with the invention, there is provided also a new computer program product. The computer program product comprises a non-volatile computer readable medium, e.g. a compact disc "CD", encoded with a computer program according to the invention.

Various exemplifying and non-limiting embodiments of the invention are described in accompanied dependent claims.

Exemplifying and non-limiting embodiments of the invention both as to constructions and to methods of operation, together with additional objects and advantages thereof, are best understood from the following description of specific exemplifying embodiments when read in conjunction with the accompanying drawings.

The verbs "to comprise" and "to include" are used in this document as open limitations that neither exclude nor require the existence of un-recited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF DRAWINGS

Exemplifying and non-limiting embodiments of the invention and their advantages are explained in greater detail below with reference to the accompanying drawings, in which.

DETAILED DESCRIPTION

The specific examples provided in the description below should not be construed as limiting the scope and/or the applicability of the accompanied claims. Lists and groups of examples provided in the description below are not exhaustive unless otherwise explicitly stated.

Figure 1:
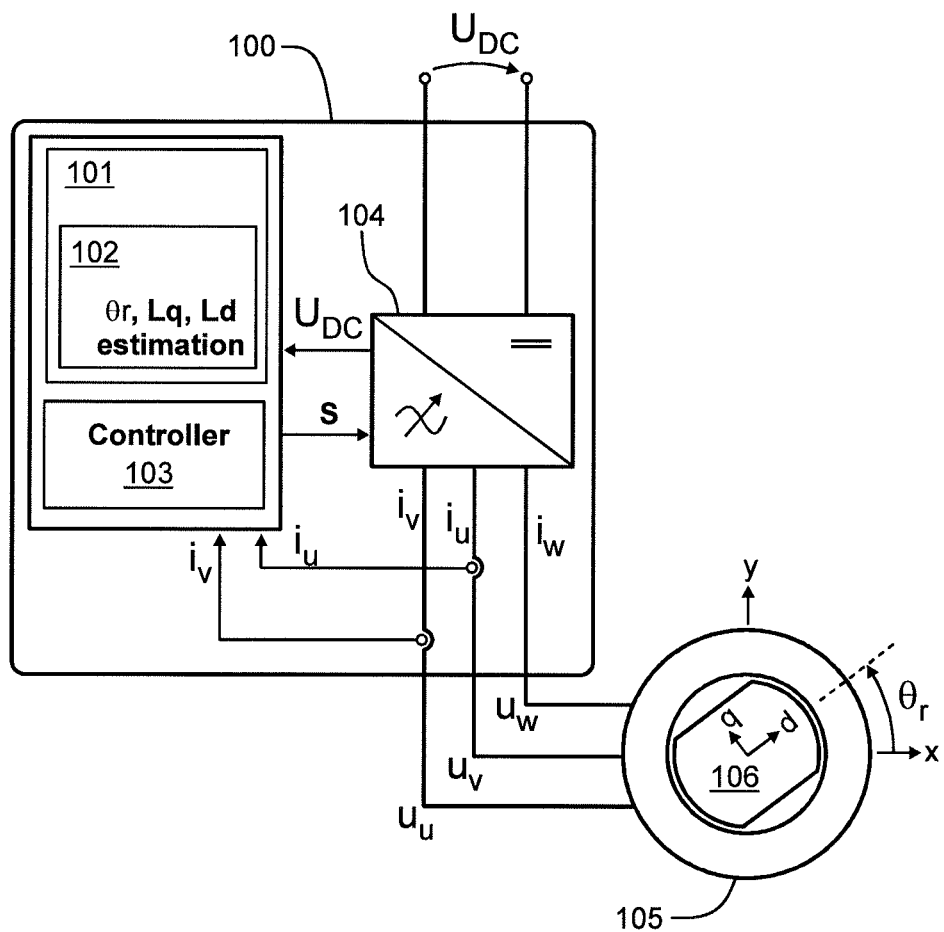
FIG. 1 illustrates a power electronic converter according to an exemplifying and non-limiting embodiment.

FIG. 1 illustrates a power electronic converter 100 according to an exemplifying and non-limiting embodiment. The power electronic converter 100 comprises a converter stage 104 for forming stator voltages for an electric machine 105. In FIG. 1, the stator phase voltages are denoted as $u_u$, $u_v$, and $u_w$. In the exemplifying case shown in FIG. 1, the input voltage of the power electronic converter 100 is direct "DC" voltage $U_{DC}$. It is also possible that the input voltage is e.g. three-phase alternating "AC" voltage. In this exemplifying case, the power electronic converter may comprise for example a rectifier and a DC-voltage intermediate circuit between the rectifier and the converter stage 104. The converter stage 104 can be configured to employ e.g. pulse width modulation "PWM" for converting the DC-voltage $U_{DC}$ into the stator voltages $u_u$, $u_v$, and $u_w$. It is however also possible that the converter stage 104 is a matrix converter stage for carrying out a direct conversion from e.g. three-phase input AC-voltage to the stator voltages $u_u$, $u_v$, and $u_w$ of the electric machine 105. The power electronic converter 100 further comprises a controller 103 for controlling the stator voltages $u_u$, $u_v$, and $u_w$ of the electric machine 105. In FIG. 1, a set of switch control values delivered by the controller 103 to the converter stage 104 is denoted with s. The controller 103 may comprise means for implementing different control modes such as one or more vector control modes and a scalar control mode. In a vector control mode, the controller 103 may control the stator voltages $u_u$, $u_v$, and $u_w$ at least partly based on stator currents $i_u$ and $i_v$ of the electric machine 105 and on estimates of the direct-axis, i.e. d-axis, inductance $L_d$ and the quadrature-axis, i.e. q-axis, inductance $L_q$ of the electric machine 105. In the exemplifying situation shown in FIG. 1, it is assumed that the sum of stator currents $i_u$, $i_v$, and $i_w$ is zero and thus the controller 103 needs only two stator currents $i_u$ and $i_v$ since $i_w=-i_u-i_v$.

The power electronic converter 100 further comprises a device 101 according to an exemplifying and non-limiting embodiment for estimating the d-axis inductance $L_d$ and the q-axis inductance $L_q$ of the electric machine 105 when the rotor 106 of the electric machine is stationary. In many cases, the d-axis and the q-axis are selected so that the d-axis is parallel with the minimum reluctance path and the q-axis is parallel with the maximum reluctance path of a rotor. However, in case of an interior permanent magnet machine "IPM", or "IPMSM", or a permanent magnet assisted synchronous reluctance machine "PMaSynRM", the reluctance of a path perpendicular to the direction of a permanent magnet "PM" flux can be smaller than that of a path parallel with the PM-flux and the selection of the d- and q-axes can be such that the d-axis is parallel with the PM-flux, i.e. parallel with the maximum reluctance path, and the q-axis is parallel with the minimum reluctance path. In the exemplifying situation shown in FIG. 1, the rotor 106 is assumed to be stationary and the rotational position of the rotor 106 is denoted with Or. The electric machine 105 is a two-pole electric machine for demonstration purposes, but the pole number can be any positive even number. The number of phases of the electric machine 105 is three for demonstration purposes, but a different number of phases is also possible.

Figure 2A:
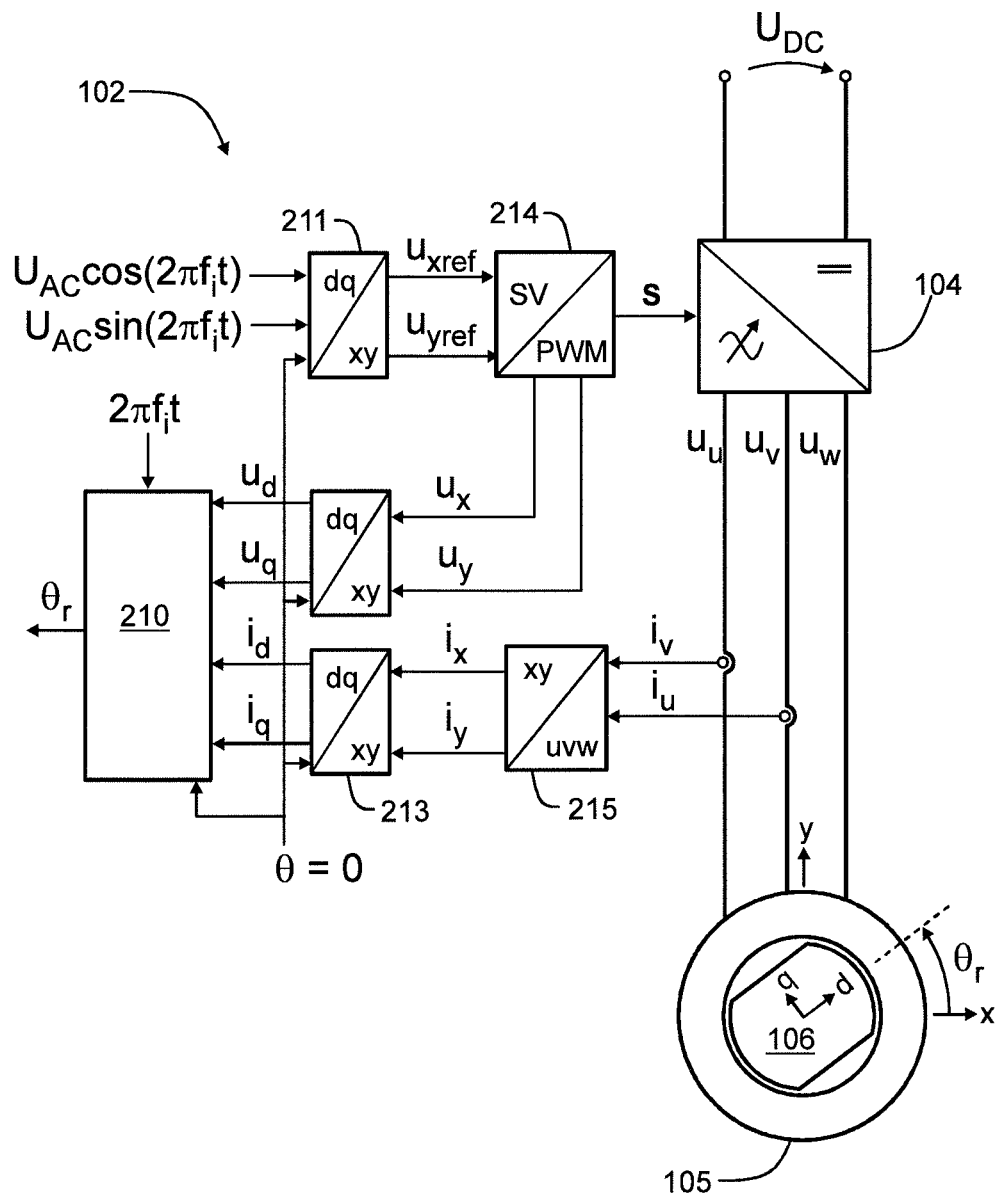
FIG. 2a shows a functional block-diagram of a device according to an exemplifying and non-limiting embodiment when the device is estimating rotational position of a rotor.

The rotational position $\theta_r$ of the rotor 106 is assumed to be unknown, and it may have any value from a range from −180 electrical degrees to +180 electrical degrees. The device 101 is configured to estimate the rotational position $\theta_r$ of the rotor 106 as a preparatory action for the determination of the d- and q-axis inductances $L_d$ and $L_q$. FIG. 2a shows an exemplifying functional block-diagram corresponding to a processing system 102 of the device 101 when the processing system 102 is estimating the rotational position $\theta_r$ of the rotor 106. The processing system 102 is configured to control the stator voltages $u_u$, $u_v$, and $u_w$ of the electric machine 105 to constitute a balanced multi-phase AC-voltage. In FIG. 2a, this is illustrated so that d-axis voltage is $U_{AC} \cos(2\pi f_i t)$ and q-axis voltage is $U_{AC} \sin(2\pi f_i t)$, where $U_{AC}$ is the amplitude of the phase voltages of the balanced multi-phase AC-voltage i.e. the length of the space-vector of the balanced multi-phase AC-voltage, $2\pi f_i$ is the angular frequency of the balanced multi-phase AC-voltage i.e. the angular speed of the space-vector of the balanced multi-phase AC-voltage, and t is time. A functional block 211 converts the above-mentioned d- and q-axis voltages from a dq-coordinate system fixed to the rotor 106 to a xy-coordinate system fixed to the stator. It is worth noting that the coordinate system conversion is carried out as if the rotational angle of the rotor 106 were zero, or some other predetermined constant. As mentioned above, the actual rotational position $\theta_r$ of the rotor 106 is assumed to be unknown. Thus, in this operational phase, the dq-coordinate system related to the functional block 211 does not necessarily correspond to the real dq-coordinate system defined by the d- and q-axes of the rotor 106. The functional block 211 produces references values $U_{xref}$ and $U_{yref}$ for the x- and y-axis voltages, and a functional block 214 converts the references values $U_{xref}$ and $U_{yref}$ into a set s of switch control values that are delivered to the converter stage 104. In the exemplifying case shown in FIG. 2a where the rotational angle of the dq-coordinate system related to the functional block 211 is chosen to be zero, the dq-coordinate system related to the functional block 211 coincides with the xy-coordinate system, i.e. $U_{xref}=U_{AC} \cos(2\pi f_i t)$ and $U_{yref}=U_{AC} \sin(2\pi f_i t)$.

The balanced multi-phase AC-voltage creates a rotating magnetic flux whose rotational speed is the above-mentioned f and thereby the angular speed is $2\pi f_i$. When stator resistances are neglected, the length of the space vector of the rotating magnetic flux is $U_{AC}/2\pi f_i$. When the rotor 106 is at standstill and the balanced multi-phase AC-voltage is supplied to the stator windings, the reluctance encountered by the rotating magnetic flux is different depending on the direction of the rotating magnetic flux with respect to the rotor 106 because of the saliency of the rotor 106, i.e. the difference between the d- and q-axis inductances $L_d$ and $L_q$. As an effect, the impedance of the stator windings is different at different time instants. Therefore, the stator currents $i_u$, $i_v$, and $i_w$ constitute an unbalanced multi-phase alternating current. The unbalance is manifested by a negative sequence component of the stator currents $i_u$, $i_v$, and $i_w$. The trajectory of the space-vector of the stator currents $i_u$, $i_v$, and $i_w$ deviates from a circle due to the negative sequence component, and the orientation of the non-circular trajectory with respect the stator phases is indicative of the rotational position $\theta_r$ of the rotor 106 in the xy-coordinate system fixed to the stator. In an exemplifying and non-limiting embodiment, the processing system 102 is configured to determine, in the xy-coordinate system, a direction in which the length of the space-vector of the stator currents $i_u$, $i_v$, and $i_w$ reaches a minimum or a maximum and to determine the rotational position $\theta_r$ of the rotor 106 based on the determined direction of the minimum or the maximum. The space-vector of the stator currents $i_u$, $i_v$, and $i_w$ in the xy-coordinate system can be computed at each moment of time e.g. as $2(i_u+ai_v-a^2(i_u+i_v))/3$, where $a=(1+j\sqrt{3})/2$, j being an imaginary unit. In cases where the d-axis inductance $L_d$ is greater than the q-axis inductance $L_q$, the direction of the minimum length of the space-vector of the stator currents $i_u$, $i_v$, and $i_w$ is parallel with the d-axis and the direction of the maximum length of the space-vector of the stator currents $i_u$, $i_v$, and $i_w$ is parallel with the q-axis. Correspondingly, in cases where the d-axis inductance $L_d$ is smaller than the q-axis inductance $L_q$, the direction of the maximum length of the space-vector of the stator currents $i_u$, $i_v$, and $i_w$ is parallel with the d-axis and the direction of the minimum length of the space-vector of the stator currents $i_u$, $i_v$, and $i_w$ is parallel with the q-axis.

The above-mentioned negative sequence component of the stator currents $i_u$, $i_v$, and $i_w$ can be understood as a space-vector whose rotation speed is the opposite number of the rotation speed of a space-vector representing the positive sequence component of the stator currents $i_u$, $i_v$, and $i_w$. In an exemplifying and non-limiting embodiment, a functional block 215 converts the stator currents $i_u$, $i_v$, and $i_w$ into x-axis current $i_x$ and y-axis current $i_y$. In the exemplifying case shown in FIG. 2a, the functional block 215 computes the current $i_w$ as $-i_u-i_v$. A functional block 213 converts the x-axis and y-axis currents $i_x$ and $i_y$ from the xy-coordinate system to the dq-coordinate system using the same rotational angle, e.g. zero, that was used by the functional block 211. In the exemplifying case shown in FIG. 2a where the rotational angle of the dq-coordinate system related to the functional blocks 211 and 213 is chosen to be zero, the dq-coordinate system related to the functional blocks 211 and 213 coincides with the xy-coordinate system, i.e. $i_d=i_x$ and $i_q=i_y$. The functional block 210 converts the dq-representation of the space-vector of the stator currents $i_u$, $i_v$, and $i_w$ into a coordinate system that rotates at angular speed $-2\pi f_i$ with respect to the stator i.e. to the xy-coordinate system. After this coordinate system transformation, the negative sequence component appears as a direct "DC" quantity and the positive sequence component appears as a double-frequency quantity that can be removed with suitable low-pass filtering such as e.g. moving average filtering. The functional block 210 is configured to carry out the above-mentioned low-pass filtering and to extract the direction angle of the low-pass filtered space-vector. The direction angle of the low-pass filtered space-vector is indicative of the rotational position $\theta_r$ of the rotor 106.

The rotating magnetic flux produced by the above-mentioned balanced multi-phase AC-voltage is advantageously selected to be so small that the rotating magnetic flux is not able to accelerate the rotor 106 to rotate together with the rotating magnetic flux, but the rotor 106 is substantially stationary. The balanced multi-phase AC-voltage needs to be however so strong that the negative sequence component is sufficient for reliable detection of the rotational position $\theta_r$. In an exemplifying case, the processing system 102 is configured to set the $U_{AC}/f_i$-ratio to be in a range from 5% to 15%, e.g. 10%, of the $U_N/f_N$-ratio, where $U_N$ is the amplitude of the nominal i.e. nameplate phase voltage the electric machine 105 and $f_N$ is the nominal i.e. nameplate supply frequency the electric machine 105. In this exemplifying case, the rotating magnetic flux produced by the balanced multi-phase AC-voltage is from 5% to 15% of the nominal magnetic flux of the electric machine 105. For example, in an exemplifying case where the nominal supply frequency $f_N$ is e.g. 70 Hz and the frequency f of the above-mentioned balanced multi-phase AC-voltage is e.g. 50 Hz, $U_{AC}$ which produces 10% of the nominal magnetic flux is 50 Hz×0.1×$U_N$/(70 Hz) i.e. 7.1% of $U_N$. In many cases, to facilitate compensation for delays in a measurement system, the frequency $f_i$ of the balanced multi-phase AC-voltage is advantageously smaller than the nominal supply frequency $f_N$.

Figure 2B:
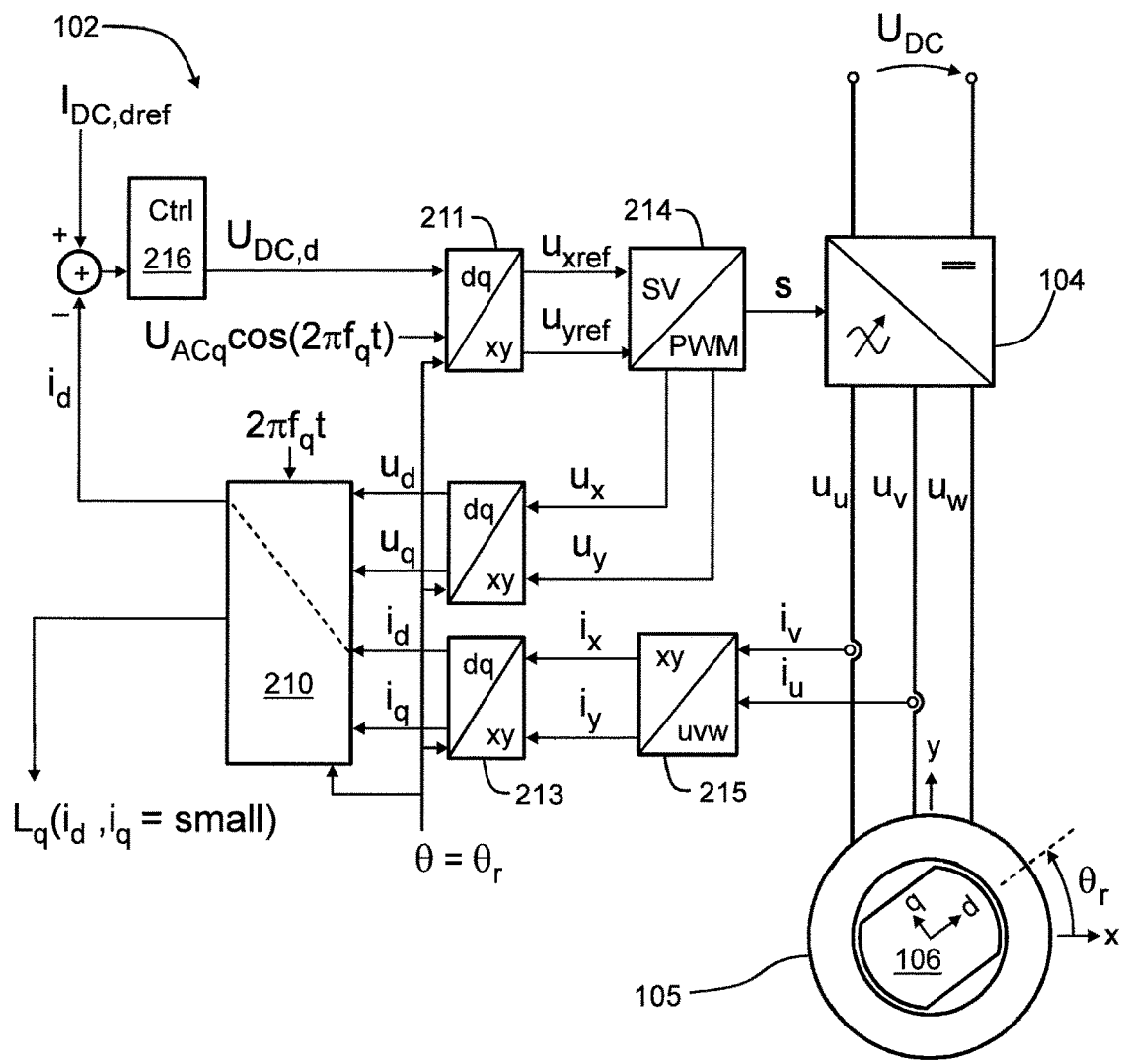
FIG. 2b shows a functional block-diagram of the device when the device is estimating quadrature-axis inductance.
Figure 2B:
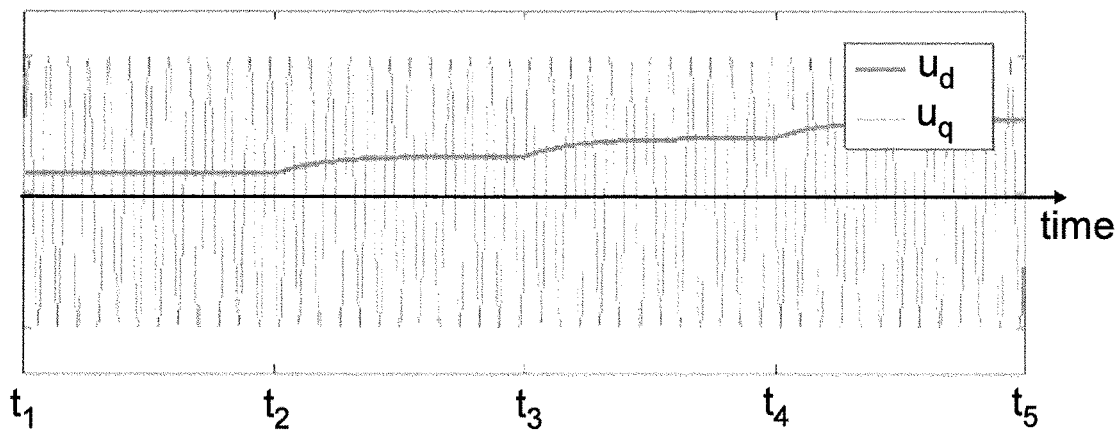

FIG. 2b shows an exemplifying functional block-diagram corresponding to the processing system 102 of the device 101 when the processing system 102 is estimating the q-axis inductance $L_q$ as a function of the d-axis current $i_d$ i.e. $L_q=L_q(i_d, i_q\approx 0)$. The processing system 102 is configured to control the d-axis current $i_d$ to be DC-current and the q-axis voltage of the electric machine to be AC-voltage $u_q=U_{ACq}$ cos $(2\pi f_q t)$, where $U_{ACq}$ is the amplitude of the q-axis AC-voltage and $f_q$ is the frequency of the q-axis AC-voltage. A functional control block 216 drives the d-axis current $i_d$ to a refence value $I_{DC,dref}$ by controlling d-axis DC-voltage $U_{DC,d}$ based on the difference $I_{DC,dref}-i_d$. The functional control block 216 may comprise for example a proportional and integrating "PI" controller or a two-level hysteresis controller i.e. a bang-bang-controller. The functional block 211 converts the above-mentioned d- and q-axis voltages from the dq-coordinate system fixed to the rotor 106 to the xy-coordinate system fixed to the stator. The conversion is carried out according to the estimated rotational position $\theta_r$ of the rotor 106. The functional block 211 produces the references values $u_{xref}$ and $u_{yref}$ for the x- and y-axis voltages, and the functional block 214 converts the references values $u_{xref}$ and $u_{yref}$ into the sets of switch control values that are delivered to the converter stage 104. The functional block 215 converts the stator currents $i_u$, $i_v$, and $i_w$ into x-axis current $i_x$ and y-axis current $i_y$. In the exemplifying case shown in FIG. 2b, the functional block 215 computes the current $i_w$ as $-i_u-i_v$. A functional block 213 converts the x-axis and y-axis currents $i_x$ and $i_y$ from the xy-coordinate system to the dq-coordinate system using the estimated rotational position $\theta_r$ of the rotor 106. The functional block 210 produces the estimate of the q-axis inductance $L_q$ as the function of the d-axis current $i_d$ based on: i) the q-axis AC-voltage $u_q$, ii) the frequency $f_q$ of the q-axis AC-voltage, and iii) the q-axis current $i_q$ that is AC-current caused by the q-axis AC voltage. FIG. 2b shows the waveforms of the q-axis AC-voltage $u_q$ and the d-axis voltage $u_d$ in an exemplifying case where the refence value $I_{DC,dref}$ of the d-axis DC-current is increased so that $I_{DC,dref}$ has a first value during a first time interval $t_1 \ldots t_2$, $I_{DC,dref}$ is increased to a second value during a second time interval $t_2 \ldots t_3$, $I_{DC,dref}$ is increased to a third value during a third time interval $t_3 \ldots t_4$, and $I_{DC,dref}$ is increased to a fourth value during a fourth time interval $t_4 \ldots t_4$. Thus, multiple points of the saturation curve of the q-axis inductance $L_q$ are obtained as the function of the d-axis current $i_d$.

In an exemplifying and non-limiting embodiment, the processing system 102 is configured to set the ratio of the amplitude of the q-axis AC-voltage and the frequency of the q-axis AC-voltage, i.e. the $U_{ACq}/f_q$-ratio, to be in a range from 1% to 5%, e.g. 3%, of the $U_N/f_N$-ratio, where $U_N$ is the amplitude of the nominal phase voltage the electric machine 105 and $f_N$ is the nominal supply frequency the electric machine 105. In this exemplifying case, the amplitude of the alternating q-axis flux linkage produced by the q-axis AC-voltage is in the range from 1% to 5% of the nominal flux linkage of the electric machine 105. For example, in a case where the $U_{ACq}$ is 7.5% of $U_N$ and $f_q$ is 2.5×$f_N$, the amplitude of the alternating q-axis flux linkage produced by the q-axis AC-voltage is 3% of the nominal flux linkage of the electric machine. With this exemplifying selection, the alternating q-axis flux linkage is sufficiently low to satisfy the $i_q\approx 0$ approximation.

Figure 2C:
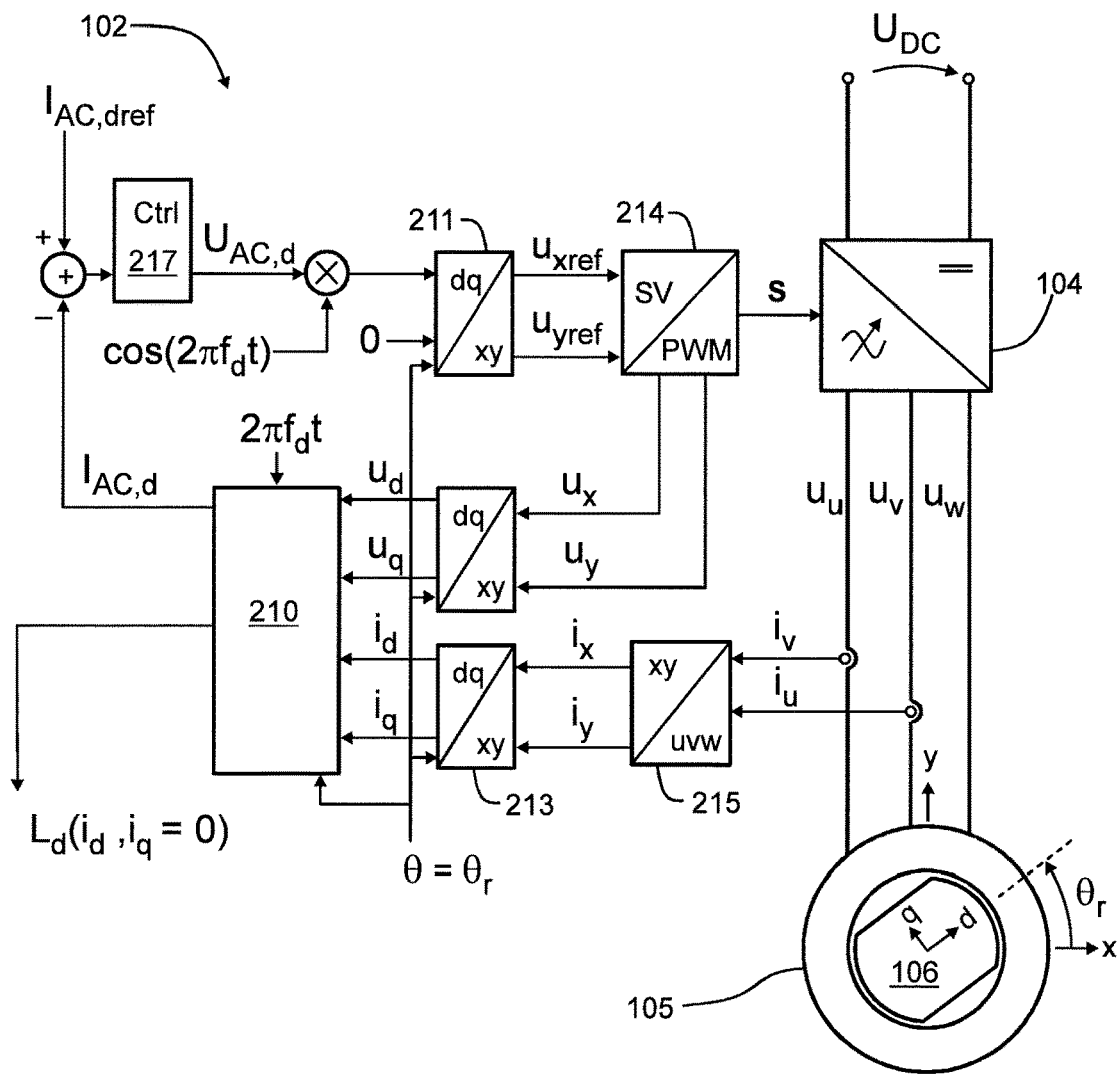
FIG. 2c shows a functional block-diagram of the device when the device is estimating direct-axis inductance.
Figure 2C:
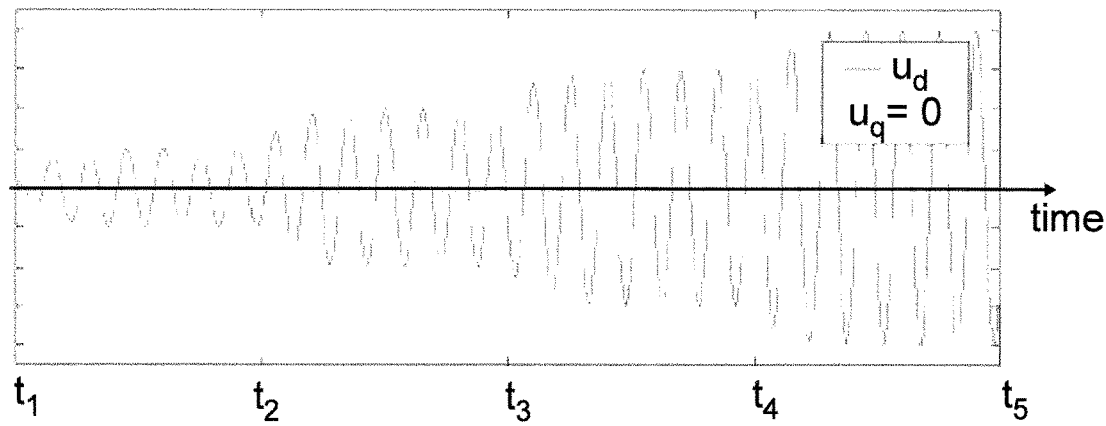

FIG. 2c shows an exemplifying functional block-diagram corresponding to the processing system 102 of the device 101 when the processing system 102 is estimating the d-axis inductance $L_d$ as a function of the d-axis current $i_d$ i.e. $L_d=L_d(i_d, i_q\approx 0)$. The processing system 102 is configured to control the d-axis current $i_d$ to be AC-current and the q-axis voltage of the electric machine to be substantially zero, i.e. $u_q=0$. Thus, the processing system 102 is configured control the d-axis voltage $u_d$ to be AC-voltage. The q-axis current $i_q$ is substantially zero since $u_q=0$. A functional control block 217 drives the amplitude $I_{AC,d}$ of the d-axis AC-current to a refence value $I_{AC,dref}$ by controlling the amplitude $U_{AC,d}$ of the d-axis AC-voltage $u_d=U_{AC,d}$ cos $(2\pi f_d t)$ based on the difference $I_{AC,dref}-I_{AC,d}$, where $f_d$ is the frequency of the d-axis AC-voltage. The functional control block 217 may comprise for example a two-level hysteresis controller i.e. a bang-bang-controller, or a PI-controller. The functional block 211 converts the d- and q-axis voltages from the dq-coordinate system fixed to the rotor 106 to the xy-coordinate system fixed to the stator. The conversion is carried out according to the estimated rotational position $\theta_r$ of the rotor 106. The functional block 211 produces the references values $U_{xref}$ and $u_{yref}$ for the x- and y-axis voltages, and the functional block 214 converts the references values $u_{xref}$ and $u_{yref}$ into the set s of switch control values that are delivered to the converter stage 104. The functional block 215 converts the stator currents $i_u$, $i_v$, and $i_w$ into x-axis current $i_x$ and y-axis current $i_y$. In the exemplifying case shown in FIG. 2c, the functional block 215 computes the current $i_w$ as $-i_u-i_v$. A functional block 213 converts the x-axis and y-axis currents $i_x$ and $i_y$ from the xy-coordinate system to the dq-coordinate system using the estimated rotational position $\theta_r$ of the rotor 106. The functional block 210 produces the estimate of the d-axis inductance $L_d$ as the function of the d-axis current $i_d$ based on: i) the amplitude of the d-axis AC-voltage $U_{AC,d}$, ii) the frequency $f_d$ of the d-axis AC-voltage, and iii) the amplitude $I_{AC,d}$ of the d-axis AC-current. FIG. 2c shows the waveform of the d-axis AC-voltage $u_d$ in an exemplifying case where the refence value $I_{AC,dref}$ of the d-axis AC-current is increased so that $I_{AC,dref}$ has a first value during a first time interval $t_1 \ldots t_2$, $I_{AC,dref}$ is increased to a second value during a second time interval $t_2 \ldots t_3$, $I_{AC,dref}$ is increased to a third value during a third time interval $t_3 \ldots t_4$, and $I_{AC,dref}$ is increased to a fourth value during a fourth time interval $t_4 \ldots t_4$. Thus, multiple points of the saturation curve of the d-axis inductance $L_d$ are obtained as the function of the amplitude $I_{AC,d}$ of the d-axis AC-current.

In an exemplifying and non-limiting embodiment, the processing system 102 is configured to set the frequency $f_d$ of the d-axis AC-voltage to be less than the nominal supply frequency $f_N$ of the electric machine 105. When the frequency $f_d$ is less than $f_N$, the amplitude of the alternating d-axis flux linkage can be raised above the nominal flux linkage level of the electric machine without a need to exceed the nominal voltage level of the electric machine. Thus, a sufficiently high-reaching saturation curve for the d-axis inductance $L_d$ can be obtained. The frequency $f_d$ can be for example about 67% of $f_N$.

In the above-described procedures for estimating the inductances $L_d$ and $L_q$ and their saturation curves, the amplitude of appropriate AC-current is extracted based on measured currents and the extracted amplitude value is filtered to obtain an average amplitude value. Then, each inductance value is calculated as a ratio of the amplitude of the corresponding AC-voltage and the average amplitude value divided by the angular frequency of the AC-voltage. In many cases, the effect of stator resistance can be neglected in the inductance calculation. It is however also possible to arrange a mathematical compensation for the stator resistance in the inductance calculation. The estimated inductance values can be stored for example in a look-up table for later use.

The processing system 102 shown in FIG. 1 can be implemented with one or more processor circuits, each of which can be a programmable processor circuit provided with appropriate software, a dedicated hardware processor such as for example an application specific integrated circuit "ASIC", or a configurable hardware processor such as for example a field programmable gate array "FPGA". Furthermore, the processing system may comprise one or more memory devices each of which can be for example a Random-Access-Memory "RAM" circuit. In many power electronic converters, a device according to an exemplifying and non-limiting embodiment for estimating inductances can be implemented using the hardware of the control system of the power electronic converter.

The above-described control device 101 is an example of a device that comprises:
means for controlling stator voltages of an electric machine to constitute a balanced multi-phase alternating voltage,
means for estimating rotational position of the rotor of the electric machine based on a negative sequence component of stator currents of the electric machine, the negative sequence component being caused by saliency of the rotor,
means for controlling direct-axis current of the electric machine to be direct current and quadrature-axis voltage of the electric machine to be alternating voltage,
means for estimating the quadrature-axis inductance of the electric machine based on the quadrature-axis alternating voltage and on quadrature-axis alternating current caused by the quadrature-axis alternating voltage,
means for controlling direct-axis voltage of the electric machine to be alternating voltage and the quadrature-axis voltage of the electric machine to be substantially zero, and
means for estimating the direct-axis inductance of the electric machine based on the direct-axis alternating voltage and on direct-axis alternating current caused by the direct-axis alternating voltage.

Figure 3:
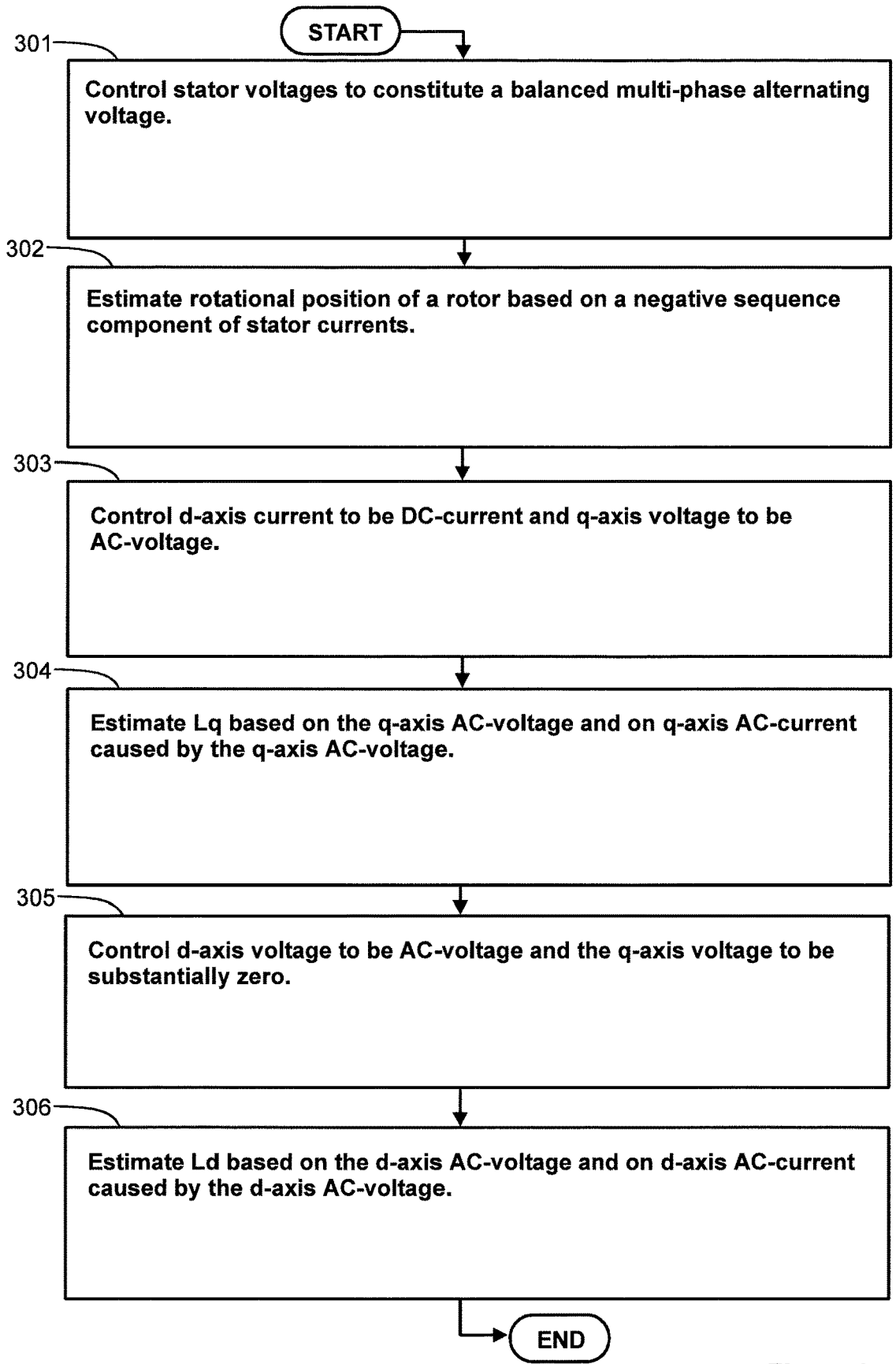
FIG. 3 shows a flowchart of a method according to an exemplifying and non-limiting embodiment for estimating inductances of an electric machine.

FIG. 3 shows a flowchart of a method according to an exemplifying and non-limiting embodiment for estimating inductances of an electric machine when the rotor of the electric machine is stationary. The method comprises the following actions:
action 301: controlling stator voltages of the electric machine to constitute a balanced multi-phase alternating voltage,
action 302: estimating rotational position of the rotor based on a negative sequence component of stator currents of the electric machine, the negative sequence component being caused by saliency of the rotor,
action 303: controlling d-axis current of the electric machine to be DC-current and q-axis voltage of the electric machine to be AC-voltage,
action 304: estimating the q-axis inductance of the electric machine based on the q-axis AC-voltage and on q-axis AC-current caused by the q-axis AC-voltage,
action 305: controlling d-axis voltage of the electric machine to be AC-voltage and the q-axis voltage of the electric machine to be substantially zero, and
action 306: estimating the d-axis inductance of the electric machine based on the d-axis AC-voltage and on d-axis AC-current caused by the d-axis AC-voltage.

A method according to an exemplifying and non-limiting embodiment comprises determining a direction in which the length of a space-vector of the stator currents reaches a minimum or a maximum, and the method comprises determining the rotational position of the rotor based on the determined direction of the minimum or the maximum.

In a method according to an exemplifying and non-limiting embodiment, a ratio of amplitude of phase-voltages of the balanced multi-phase alternating voltage and frequency of the balanced multi-phase alternating voltage, i.e. the U/f-ratio, is in a range from 5% to 15% of a ratio of amplitude of the nominal phase voltage of the electric machine and the nominal supply frequency of the electric machine so as to produce a rotating magnetic flux whose amplitude is in a range from 5% to 15% of a nominal magnetic flux of the electric machine. The frequency of the balanced multi-phase alternating voltage can be for example equal to or less than the nominal supply frequency of the electric machine.

A method according to an exemplifying and non-limiting embodiment comprises varying, when estimating the q-axis inductance, a value of the d-axis DC-current so as to obtain an estimate of the q-axis inductance as a function of the d-axis DC-current.

In a method according to an exemplifying and non-limiting embodiment, a ratio of amplitude of the q-axis AC-voltage and frequency of the q-axis AC-voltage is, when estimating the q-axis inductance, in a range from 1% to 5% of the ratio of the amplitude of the nominal phase voltage of the electric machine and the nominal supply frequency of the electric machine so as to produce an alternating q-axis flux linkage whose amplitude is in a range from 1% to 5% of a nominal flux linkage of the electric machine.

A method according to an exemplifying and non-limiting embodiment comprises varying, when estimating the d-axis inductance, amplitude of the d-axis AC-voltage so as to obtain an estimate of the d-axis inductance as a function of the d-axis current.

In a method according to an exemplifying and non-limiting embodiment, the frequency of the d-axis AC-voltage is less than the nominal supply frequency of the electric machine when estimating the d-axis inductance.

In a method according to an exemplifying and non-limiting embodiment, the electric machine is a synchronous reluctance machine, an interior permanent magnet machine, or a permanent magnet assisted synchronous reluctance machine.

A computer program according to an exemplifying and non-limiting embodiment comprises computer executable instructions for controlling a programmable processor to carry out actions related to a method according to any of the above-described exemplifying and non-limiting embodiments.

A computer program according to an exemplifying and non-limiting embodiment comprises software modules for estimating inductances of an electric machine when the rotor of the electric machine is stationary. The software modules comprise computer executable instructions for controlling a programmable processor to:
- control stator voltages of the electric machine to constitute a balanced multi-phase alternating voltage,
- estimate rotational position of the rotor based on a negative sequence component of stator currents of the electric machine, the negative sequence component being caused by saliency of the rotor,
- control d-axis current of the electric machine to be DC-current and q-axis voltage of the electric machine to be AC-voltage,
- estimate the q-axis inductance of the electric machine based on the q-axis AC-voltage and on q-axis AC-current caused by the q-axis AC-voltage,
- control d-axis voltage of the electric machine to be AC-voltage and the q-axis voltage of the electric machine to be substantially zero, and
- estimate the d-axis inductance of the electric machine based on the d-axis AC-voltage and on d-axis AC-current caused by the d-axis AC-voltage.

The above-mentioned software modules can be e.g. subroutines and/or functions implemented with a programming language suitable for the programmable processor under consideration.

A computer program product according to an exemplifying and non-limiting embodiment comprises a computer readable medium, e.g. a compact disc "CD", encoded with a computer program according to an exemplifying embodiment.

A signal according to an exemplifying and non-limiting embodiment is encoded to carry information that defines a computer program according to an exemplifying embodiment.

The non-limiting, specific examples provided in the description given above should not be construed as limiting the scope and/or the applicability of the appended claims. Furthermore, any list or group of examples presented in this document is not exhaustive unless otherwise explicitly stated.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A device for estimating inductances of an electric machine when a rotor of the electric machine is stationary, the device comprising a processing system configured to:
   - control stator voltages of the electric machine to constitute a balanced multi-phase alternating voltage,
   - estimate rotational position of the rotor based on a negative sequence component of stator currents of the electric machine, the negative sequence component being caused by saliency of the rotor,
   - control direct-axis current of the electric machine to be direct current and quadrature-axis voltage of the electric machine to be alternating voltage,
   - estimate quadrature-axis inductance of the electric machine based on the quadrature-axis alternating voltage and on quadrature-axis alternating current caused by the quadrature-axis alternating voltage,
   - control direct-axis voltage of the electric machine to be alternating voltage and the quadrature-axis voltage of the electric machine to be substantially zero, and
   - estimate direct-axis inductance of the electric machine based on the direct-axis alternating voltage and on direct-axis alternating current caused by the direct-axis alternating voltage,
   - wherein the processing system is configured to set a ratio of amplitude of phase-voltages of the balanced multi-phase alternating voltage and frequency of the balanced multi-phase alternating voltage to be in a range from 5% to 15% of a ratio of amplitude of a nominal phase voltage of the electric machine and a nominal supply frequency of the electric machine so as to produce a rotating magnetic flux whose amplitude is in a range from 5% to 15% of a nominal magnetic flux of the electric machine.

2. The device according to claim 1, wherein the processing system is configured to determine a direction in which a length of a space-vector of the stator currents reaches a minimum or a maximum and to determine the rotational position the rotor based on the determined direction of the minimum or the maximum.

3. The device according to claim 1, wherein the processing system is configured to set the frequency of the balanced multi-phase alternating voltage to be equal to or less than the nominal supply frequency of the electric machine.

4. The device according to claim 1, wherein the processing system is configured to set the frequency of the balanced multi-phase alternating voltage to be greater than the nominal supply frequency of the electric machine.

5. The device according to claim 1, wherein the processing system is configured to vary, when estimating the quadrature-axis inductance, a value of the direct-axis direct current so as to obtain an estimate of the quadrature-axis inductance as a function of the direct-axis direct current.

6. The device according to claim 1, wherein the processing system is configured to set, when estimating the quadrature-axis inductance, a ratio of amplitude of the quadrature-axis alternating voltage and frequency of the quadrature-axis alternating voltage to be in a range from 1% to 5% of a ratio of amplitude of a nominal phase voltage of the electric machine and a nominal supply frequency of the electric machine so as to produce an alternating quadrature-axis flux linkage whose amplitude is in a range from 1% to 5% of a nominal flux linkage of the electric machine.

7. The device according to claim 1, wherein the processing system is configured to vary, when estimating the direct-axis inductance, amplitude of the direct-axis alternating voltage so as to obtain an estimate of the direct-axis inductance as a function of the direct-axis current.

8. The device according to claim 1, wherein the processing system is configured to set, when estimating the direct-axis inductance, frequency of the direct-axis alternating voltage to be less than a nominal supply frequency of the electric machine.

9. A power electronic converter comprising:
   a converter stage for forming stator voltages for an electric machine,
   a controller for controlling the stator voltages at least partly based on stator currents of the electric machine, and
   a device for estimating the direct-axis and quadrature-axis inductances of the electric machine when a rotor of the electric machine is stationary,
wherein the device comprises a processing system configured to:
   set the controller to control the stator voltages to constitute a balanced multi-phase alternating voltage,
   estimate rotational position of the rotor based on a negative sequence component of the stator currents, the negative sequence component being caused by saliency of the rotor,
   set the controller to control direct-axis current of the electric machine to be direct current and quadrature-axis voltage of the electric machine to be alternating voltage,
   estimate the quadrature-axis inductance of the electric machine based on the quadrature-axis alternating voltage and on quadrature-axis alternating current caused by the quadrature-axis alternating voltage,
   set the controller to control direct-axis voltage of the electric machine to be alternating voltage and the quadrature-axis voltage of the electric machine to be substantially zero,
   estimate the direct-axis inductance of the electric machine based on the direct-axis alternating voltage and on direct-axis alternating current caused by the direct-axis alternating voltage, and
   set a ratio of amplitude of phase-voltages of the balanced multi-phase alternating voltage and frequency of the balanced multi-phase alternating voltage to be in a range from 5% to 15% of a ratio of amplitude of a nominal phase voltage of the electric machine and a nominal supply frequency of the electric machine so as to produce a rotating magnetic flux whose amplitude is in a range from 5% to 15% of a nominal magnetic flux of the electric machine.

10. A method for estimating inductances of an electric machine when a rotor of the electric machine is stationary, the method comprising:
   controlling stator voltages of the electric machine to constitute a balanced multi-phase alternating voltage,
   estimating rotational position of the rotor based on a negative sequence component of stator currents of the electric machine, the negative sequence component being caused by saliency of the rotor,
   controlling direct-axis current of the electric machine to be direct current and quadrature-axis voltage of the electric machine to be alternating voltage,
   estimating quadrature-axis inductance of the electric machine based on the quadrature-axis alternating voltage and on quadrature-axis alternating current caused by the quadrature-axis alternating voltage,
   controlling direct-axis voltage of the electric machine to be alternating voltage and the quadrature-axis voltage of the electric machine to be substantially zero, and
   estimating direct-axis inductance of the electric machine based on the direct-axis alternating voltage and on direct-axis alternating current caused by the direct-axis alternating voltage,
   wherein a ratio of amplitude of phase-voltages of the balanced multi-phase alternating voltage and frequency of the balanced multi-phase alternating voltage is in a range from 5% to 15% of a ratio of amplitude of a nominal phase voltage of the electric machine and a nominal supply frequency of the electric machine so as to produce a rotating magnetic flux whose amplitude is in a range from 5% to 15% of a nominal magnetic flux of the electric machine.

11. The method according to claim 10, wherein the method comprises determining a direction in which a length of a space-vector of the stator currents reaches a minimum or a maximum, and the method comprises determining the rotational position of the rotor based on the determined direction of the minimum or the maximum.

12. The method according to claim 10, wherein the frequency of the balanced multi-phase alternating voltage is equal to or less than the nominal supply frequency of the electric machine.

13. The method according to claim 10, wherein the frequency of the balanced multi-phase alternating voltage is greater than the nominal supply frequency of the electric machine.

14. The method according to claim 10, wherein the method comprises varying, when estimating the quadrature-axis inductance, a value of the direct-axis direct current so as to obtain an estimate of the quadrature-axis inductance as a function of the direct-axis direct current.

15. The method according to claim 10, wherein, when estimating the quadrature-axis inductance, a ratio of amplitude of the quadrature-axis alternating voltage and frequency of the quadrature-axis alternating voltage is in a range from 1% to 5% of a ratio of amplitude of a nominal phase voltage of the electric machine and a nominal supply frequency of the electric machine so as to produce an alternating quadrature-axis flux linkage whose amplitude is in a range from 1% to 5% of a nominal flux linkage of the electric machine.

16. The method according to claim 10, wherein the method comprises varying, when estimating the direct-axis inductance, amplitude of the direct-axis alternating voltage so as to obtain an estimate of the direct-axis inductance as a function of the direct-axis current.

17. The method according to claim 10, wherein, when estimating the direct-axis inductance, frequency of the direct-axis alternating voltage is less than a nominal supply frequency of the electric machine.

18. The method according to claim 10, wherein the electric machine is one of the following: a synchronous reluctance machine, an interior permanent magnet machine, a permanent magnet assisted synchronous reluctance machine.

19. A non-volatile computer readable medium encoded with a computer program for estimating inductances of an electric machine when a rotor of the electric machine is stationary, the computer program comprising computer executable instructions for controlling a programmable processor to:

control stator voltages of the electric machine to constitute a balanced multi-phase alternating voltage, estimate rotational position of the rotor based on a negative sequence component of stator currents of the electric machine, the negative sequence component being caused by saliency of the rotor, control direct-axis current of the electric machine to be direct current and quadrature-axis voltage of the electric machine to be alternating voltage, estimate quadrature-axis inductance of the electric machine based on the quadrature-axis alternating voltage and on quadrature-axis alternating current caused by the quadrature-axis alternating voltage, control direct-axis voltage of the electric machine to be alternating voltage and the quadrature-axis voltage of the electric machine to be substantially zero, and estimate direct-axis inductance of the electric machine based on the direct-axis alternating voltage and on direct-axis alternating current caused by the direct-axis alternating voltage, wherein a ratio of amplitude of phase-voltages of the balanced multi-phase alternating voltage and frequency of the balanced multi-phase alternating voltage is in a range from 5% to 15% of a ratio of amplitude of a nominal phase voltage of the electric machine and a nominal supply frequency of the electric machine so as to produce a rotating magnetic flux whose amplitude is in a range from 5% to 15% of a nominal magnetic flux of the electric machine.

* * * * *